(12) United States Patent
Wang et al.

(10) Patent No.: US 8,513,041 B2
(45) Date of Patent: Aug. 20, 2013

(54) MEMS INTEGRATED CHIP AND METHOD FOR MAKING SAME

(75) Inventors: Chuan-Wei Wang, Hsin-Chu (TW);
Sheng-Ta Lee, Hsin-Chu (TW);
Hsin-Hui Hsu, Hsin-Chu (TW);
Wei-Chung Wang, Hsin-Chu (TW)

(73) Assignee: Pixart Imaging Corporation, Hsin-Chu (TW)

(*) Notice: Subject to any disclaimer, the term of this patent is extended or adjusted under 35 U.S.C. 154(b) by 470 days.

(21) Appl. No.: 12/627,480

(22) Filed: Nov. 30, 2009

(65) Prior Publication Data
US 2011/0127620 A1    Jun. 2, 2011

(51) Int. Cl.
*H01L 21/00* (2006.01)
(52) U.S. Cl.
USPC .......... 438/50; 438/51; 438/52; 438/53; 257/415; 257/416; 257/417; 257/E29.324
(58) Field of Classification Search
USPC .......... 257/E29.324, E21.613, 415, 416, 257/417, 774, E23.067, E23.174; 438/50, 438/52, 51, 53
See application file for complete search history.

(56) References Cited

U.S. PATENT DOCUMENTS

| | | |
|---|---|---|
| 6,809,412 B1 | 10/2004 | Tourino et al. |
| 7,183,622 B2 | 2/2007 | Heck et al. |
| 2005/0127499 A1* | 6/2005 | Harney et al. ............... 257/704 |
| 2007/0281381 A1 | 12/2007 | Ayazi |
| 2008/0168838 A1 | 7/2008 | Martin et al. |
| 2008/0284041 A1 | 11/2008 | Jang et al. |
| 2009/0134459 A1* | 5/2009 | Goto et al. ................... 257/347 |
| 2011/0201197 A1* | 8/2011 | Nilsson et al. ............... 438/638 |

* cited by examiner

*Primary Examiner* — Kimberly Rizkallah
*Assistant Examiner* — Maria Ligai
(74) *Attorney, Agent, or Firm* — Tung & Associates

(57) ABSTRACT

The present invention discloses a MEMS (Micro-Electro-Mechanical System) chip and a method for making the MEMS chip. The MEMS chip comprises: a first substrate having a first surface and a second surface opposing each other; a microelectronic device area on the first surface; a first MEMS device area on the second surface; and a conductive interconnection structure electrically connecting the microelectronic device area and the first MEMS device area.

7 Claims, 6 Drawing Sheets

MEMS INTEGRATED CHIP AND METHOD FOR MAKING SAME

BACKGROUND OF THE INVENTION

1. Field of Invention

The present invention relates to a Micro-Electro-Mechanical System (MEMS) integrated chip, and a method for making the MEMS integrated chip.

2. Description of Related Art

MEMS devices are used in a wide variety of products such as micro-acoustical sensor, gyro-sensor, accelerometer, etc. A MEMS chip typically includes a MEMS device and a microelectronic device, integrated together. In one prior art, the MEMS device and the microelectronic device are placed on a same surface of a wafer. By way of example, FIG. 1 is a planar view showing an integrated chip including a MEMS device area 100 and a microelectronic device (e.g., a CMOS device) area 200. The MEMS device area 100 is surrounded by a guard ring 120 to protect the microelectronic device area 200 from damages due to the etching process in making the MEMS device.

Referring to FIG. 2, which is a cross-section view along the line A-A of FIG. 1. During the manufacturing process of the microelectronic device and the MEMS device, multiple dielectric layers 19 are deposited on a substrate 11 (wherein interfaces between layers are not shown). In this prior art, a movable MEMS device (not shown) is formed in the MEMS device area by etching the dielectric layer 19 in the MEMS device area 100; thus, a space 10 is left in the MEMS device area 100. As mentioned earlier, it should be careful not to damage the microelectronic device area 200 during etching the dielectric layer 19. Therefore, a guard ring 120 is provided, which includes a polysilicon layer 12, metal layers 14, 15, 16, 17 and 18, and the multiple dielectric layers 19. The number of the metal layers may be determined according to the requirement for interconnection of the microelectronic device and the design of the MEMS device.

In order to functionally connect the microelectronic device and the MEMS device on the same surface of the wafer, an electrical connection must be provided therebetween. The foregoing prior art achieves this connection by means of one or more metal layers, such as the second metal layer 16 shown in FIG. 2. However, such one or more metal layers must go through the guard ring 120, and the positions where they go through the guard ring 120 can not form a tightly closed structure with other portions of the guard ring 120 (i.e. the contact layer 14, and the first metal layer 15 in the drawing); otherwise, it causes short circuit. Therefore, in this prior art, the microelectronic device area 200 can not be completely prevented from being damaged in the etching process for forming the MEMS device.

In addition, in the prior art, the geometry consumes more area space and is disadvantageous to area shrinkage because it places the MEMS device and the microelectronic device on the same surface.

Accordingly, it is highly desired to provide a structure which functionally connects the MEMS device and the microelectronic device but still completely protects the microelectronic device area, and furthermore reduces the required chip area.

SUMMARY OF THE INVENTION

A first objective of the present invention is to provide a MEMS integrated chip which completely protects the microelectronic device area and consumes less area space.

A second objective of the present invention is to provide a method for making the MEMS integrated chip.

To achieve the above objectives, from one perspective, the present invention provides a MEMS integrated chip comprising: a first substrate having a first surface and a second surface opposing each other; a microelectronic device area on the first surface; a first MEMS device area on the second surface; and a conductive interconnection structure electrically connecting the microelectronic device area and the first MEMS device area, wherein the conductive interconnection structure includes a through silicon via (TSV).

From another perspective, the present invention provides a method for making a MEMS chip comprising: providing a first substrate having a first surface and a second surface opposing each other; forming a microelectronic device area on the first surface; forming a conductive interconnection structure through the first substrate; forming a first MEMS device area on the second surface; and electrically connecting the microelectronic device area and the first MEMS device area by the conductive interconnection structure, wherein the steps of forming the microelectronic device area, forming the conductive interconnection structure through the first substrate, and forming the first MEMS device area on the second surface can be any sequence.

In the aforementioned MEMS chip and the method, preferably, the first substrate is a silicon-on-insulator (SOI) substrate.

In the aforementioned MEMS chip and the method, preferably, the conductive interconnection structure is a through silicon via (TSV).

In the aforementioned MEMS chip and the method, preferably, the first MEMS device area includes a movable part formed by a silicon part of the SOI substrate.

In the aforementioned MEMS chip and the method, preferably, a second substrate is further provided, which is bonded with the first substrate; the second substrate includes a second MEMS device area, which cooperates with the first MEMS device area to constitute a MEMS device.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, but not drawn according to actual scale.

One feature of the present invention is to place a microelectronic device and a MEMS device respectively on opposite sides of a substrate separately, and provide a conductive interconnection structure to electrically connect the microelectronic device area and the first MEMS device area. The conductive interconnection structure is preferably a through silicon via (TSV). The steps of making the MEMS chip can be:

1. Forming the microelectronic device first, then forming the conductive interconnection structure, and then forming the MEMS device.

2. Forming the microelectronic device first, then forming the MEMS device, and then forming the conductive interconnection structure.

3. Forming the MEMS device first, then forming the conductive interconnection structure, and then forming the microelectronic device.

4. Forming the MEMS device first, then forming the microelectronic device, and then forming the conductive interconnection structure.

5. Forming the conductive interconnection structure first, then forming the MEMS device, and then forming the microelectronic device.

6. Forming the conductive interconnection structure first, then forming the microelectronic device, and then forming the MEMS device.

After the aforementioned steps are finished, or after the step of forming the MEMS device, an encapsulation layer can be further provided to encapsulate and to seal the MEMS device. Another MEMS device can be provided on the encapsulation layer to functionally cooperate with the MEMS device on the substrate, for example, to form an out-of-plane sensor, etc.

With the aforementioned method 1 as an example, a preferred embodiment of the present invention is described below. Those skilled in this art can apply the teachings in this embodiment similarly to the aforementioned method 2 to method 6.

Figure 1:
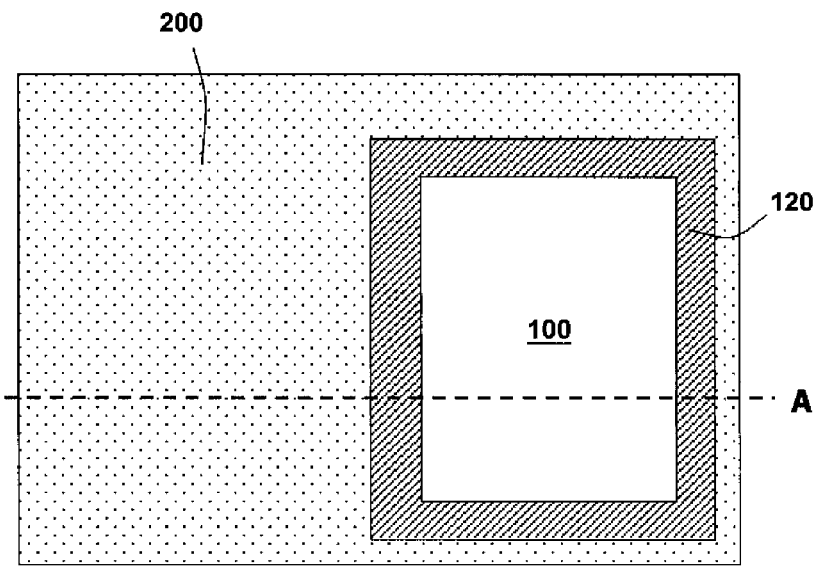
FIG. 1 and FIG. 2 show prior art.
Figure 2:
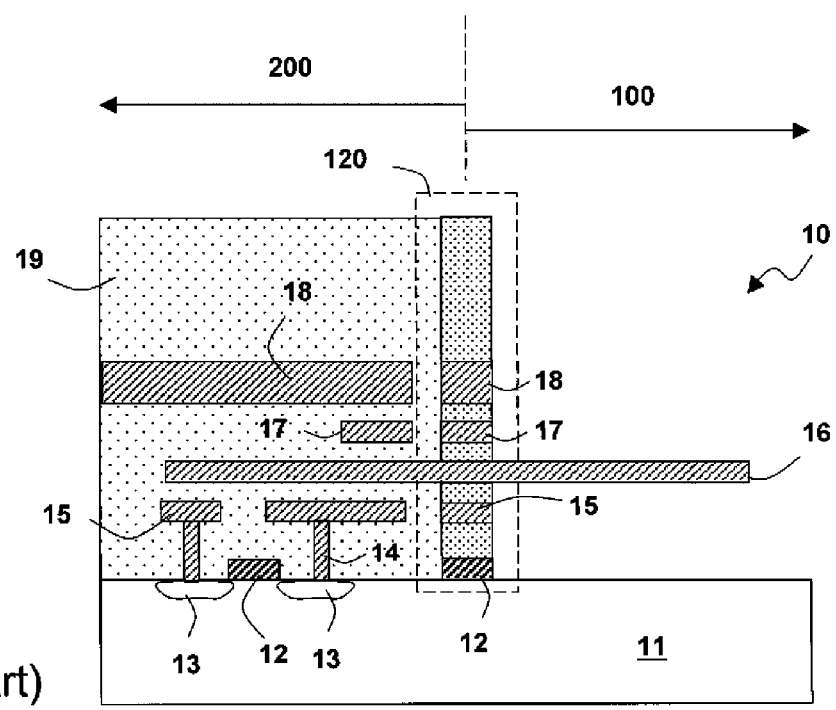
Figure 3:
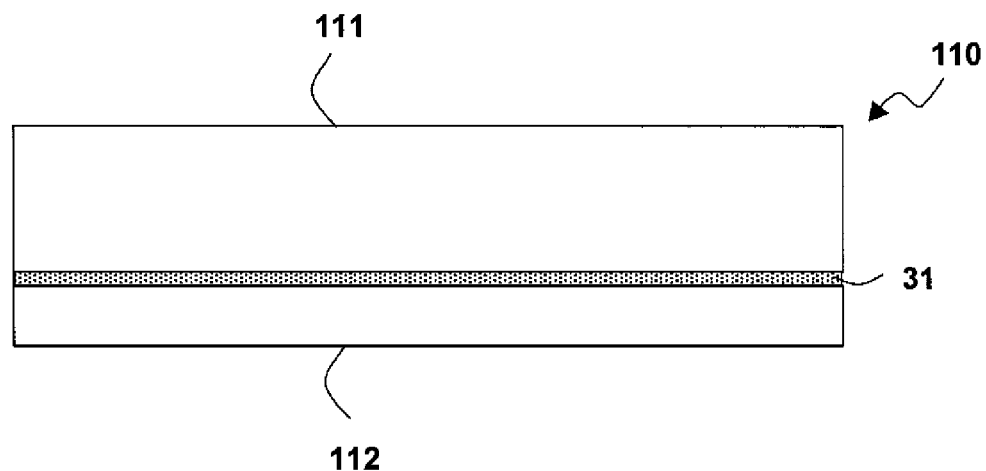
FIGS. 3-9 show a first embodiment of the present invention.
Figure 4:
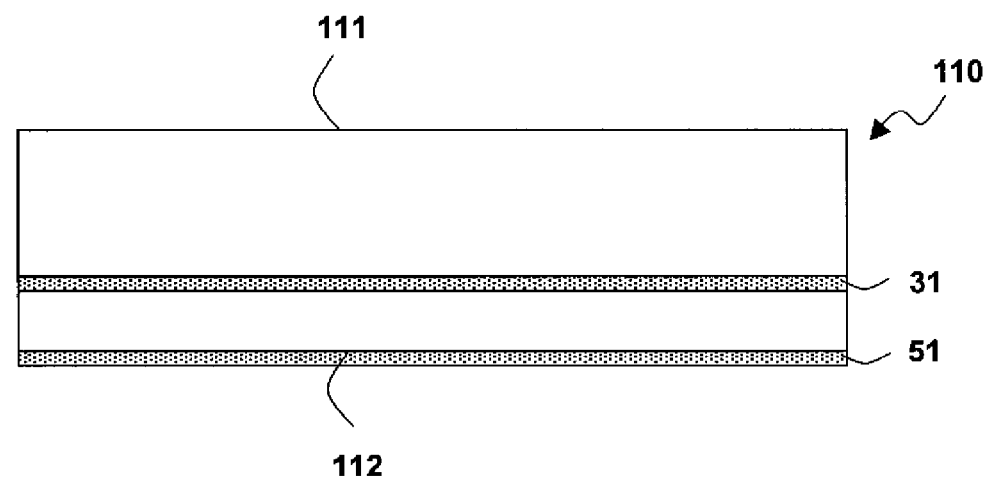
Figure 5:
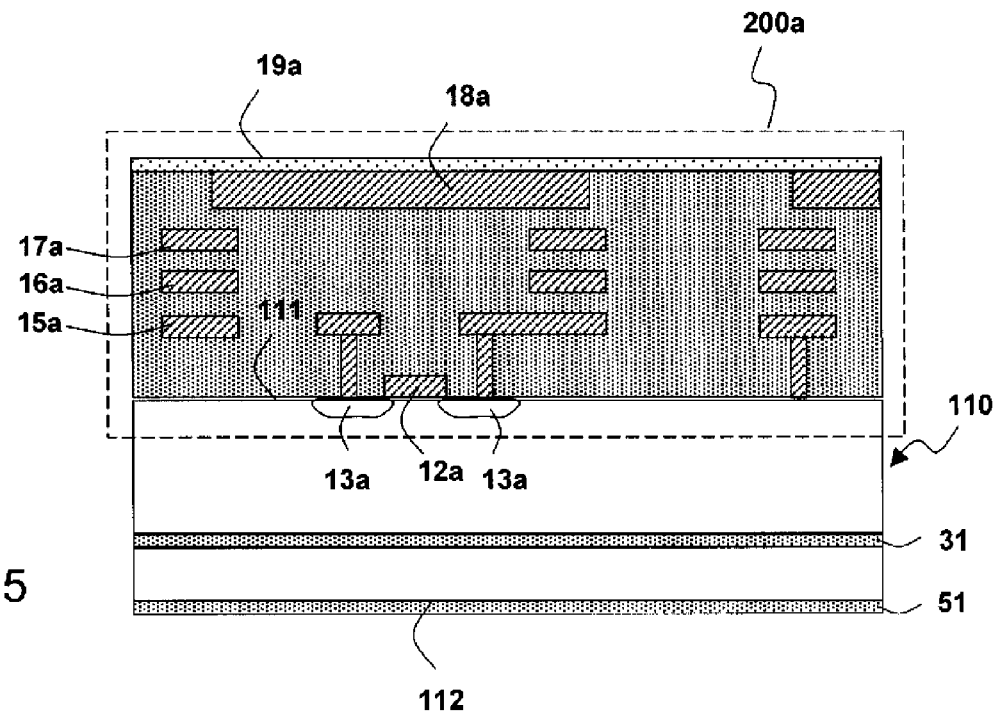

Referring to FIGS. 3-9, in this embodiment, a first substrate 110 is provided as a substrate to form a MEMS device and a microelectronic device (for example, a CMOS device) thereon. As shown in FIG. 3, the substrate can be a silicon-on-insulator (SOI) substrate having a first surface 111 and a second surface 112, and the two surfaces are separated by an insulator layer 31. As shown in FIG. 4, a protection layer 51 is deposited on the second surface 112 of the first substrate 110. The protection layer 51 can be an un-doped poly silicon layer, for example, or layers of other materials that can provide an electrically isolation function. As shown in FIG. 5, a microelectronic device area 200a is formed on the first surface 111 of the first substrate 110, including forming a doped region 13a, a gate layer 12a, metal layers 15a, 16a, 17a, 18a, and a passivation layer 19a and so forth, which are layers composing of a microelectronic device. Such layers in the microelectronic device area 200a can be formed by, e.g., a standard CMOS process.

Figure 6:
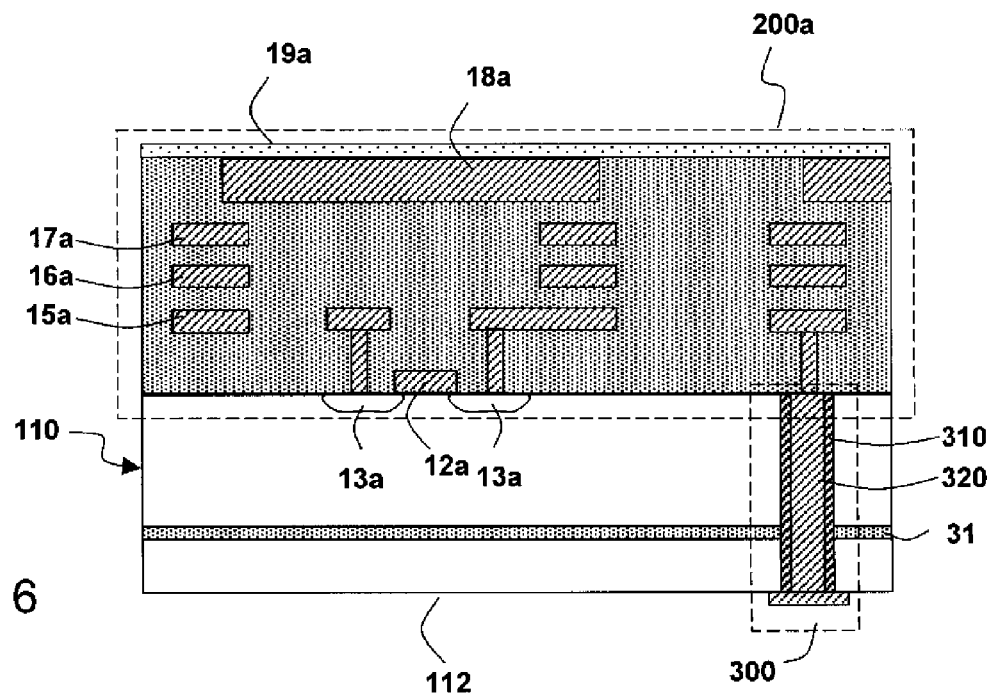

FIG. 6 shows that a conductive interconnection structure 300 is formed. In this embodiment, the conductive interconnection structure 300 is formed by the TSV method from the second surface 112 of the first substrate 110, to form an electrical connection between the MEMS device and the microelectronic device. The protection layer 51 is removed during the process. A typical TSV forming process includes: forming a via through the substrate by an etching process; forming a barrier layer 310 in the via; and then forming a conductor layer 320. The material of the barrier layer can be, e.g., titanium, titanium nitride, tantalum, tantalum nitride, or a composite structure combining the above materials. The barrier layer 310 can also be regarded as an adhesion layer because the barrier layer 310 can enhance the adhesion between the conductor layer 320 and the substrate 110. The material of the conductor layer 320 can be any material typically used to form a via in a standard CMOS process, such as tungsten, copper, etc. Note that even though the conductive interconnection structure 300 is formed by the TSV method in a preferred embodiment, the electrical connection structure between the MEMS device and the microelectronic device is not limited to the TSV. Other methods, such as wire bonding from outside the chip, also belong to the scope of the present invention.

Figure 7:
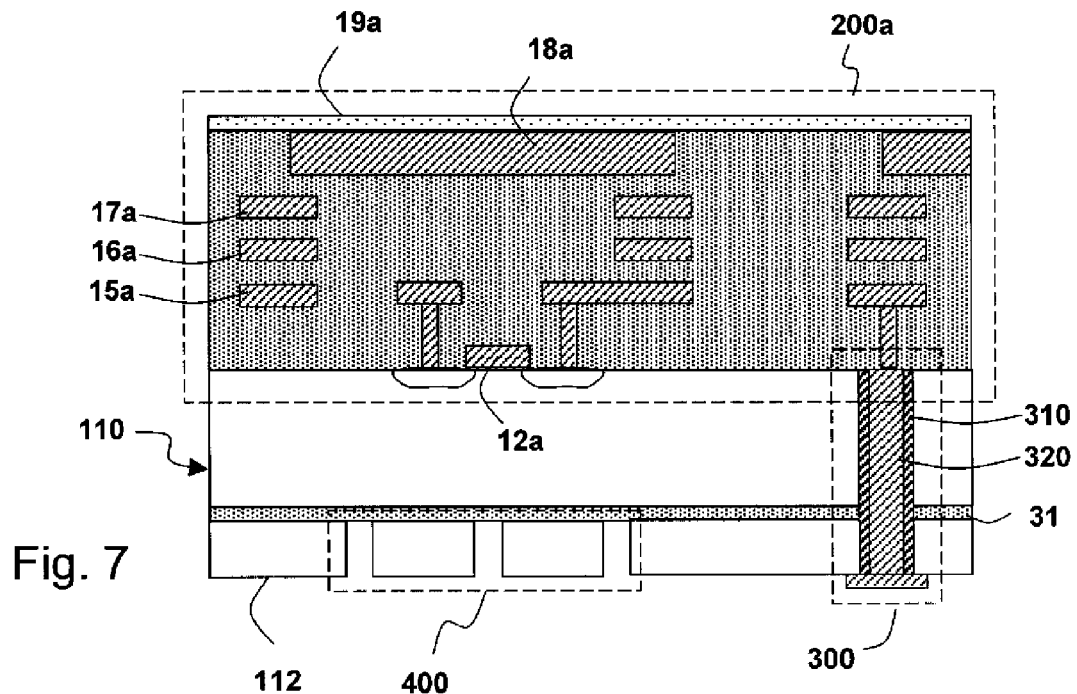
Figure 8:
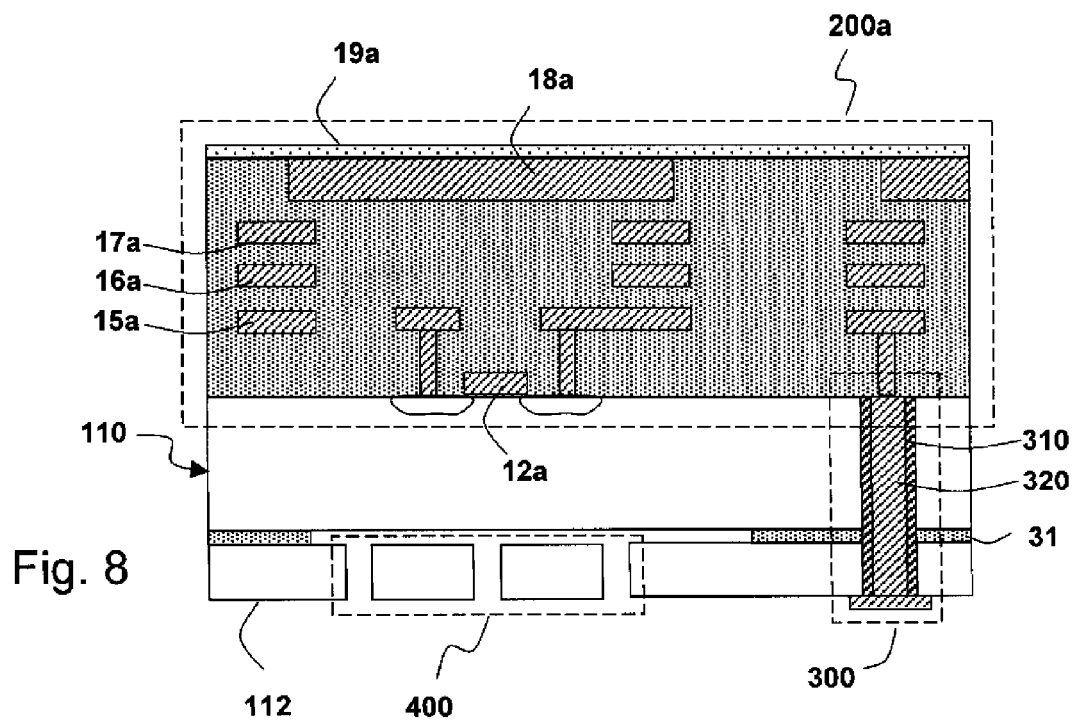
Figure 9:
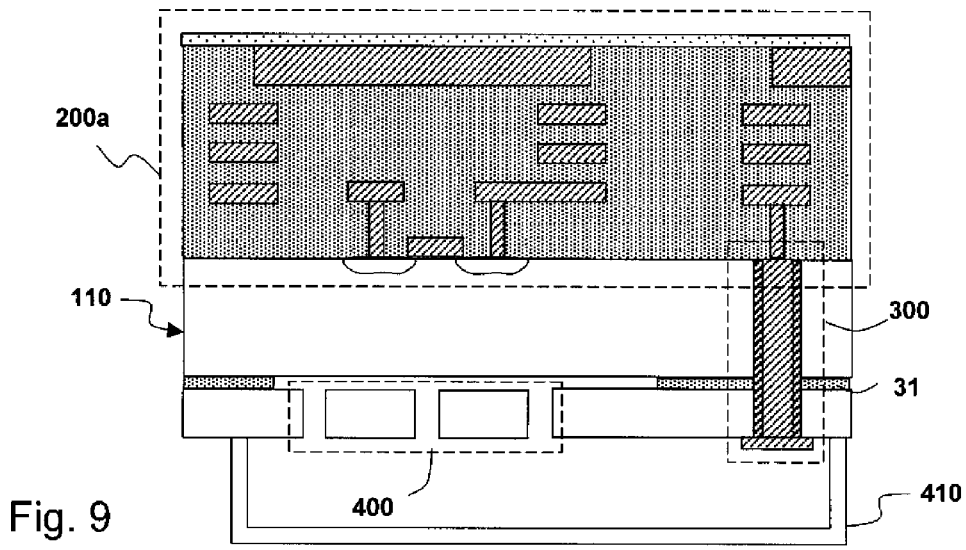

Next referring to FIG. 7, a first MEMS device 400 is formed by etching the second surface 112 of the first substrate 110. The details of the etching step are determined by the substrate material and the required topography of the MEMS device. When the substrate material is silicon, an anisotropic etching with inductively coupled plasma (ICP) or an isotropic etching with XeF2 can be adopted, for example. After the first MEMS device 400 is formed, as shown in FIG. 8, a part of the insulator layer 31 is etched away, such that the first MEMS device 400 becomes a movable part. The etching step therefor can be, e.g., HF vapor etch or buffered oxide etch. In this embodiment, the first MEMS device 400 is already a complete MEMS device. The movable part of the MEMS device is formed by the silicon part of the SOI substrate. Next, referring to FIG. 9, the first MEMS device 400 is encapsulated and protected by the encapsulation layer 410. Then the overall structure of the MEMS integrated chip is completed. As an example, the encapsulation layer can be another silicon substrate and can be bonded with the first substrate 110 by glass frit, solder, or by using a photo-sensitive polymer as the bonding material. The details of the bonding method are not the key points of the present invention, so they are omitted here. For more details, please refer to U.S. patent application Ser. No. 12/557,805, filed on Sep. 11, 2009.

Figure 10:
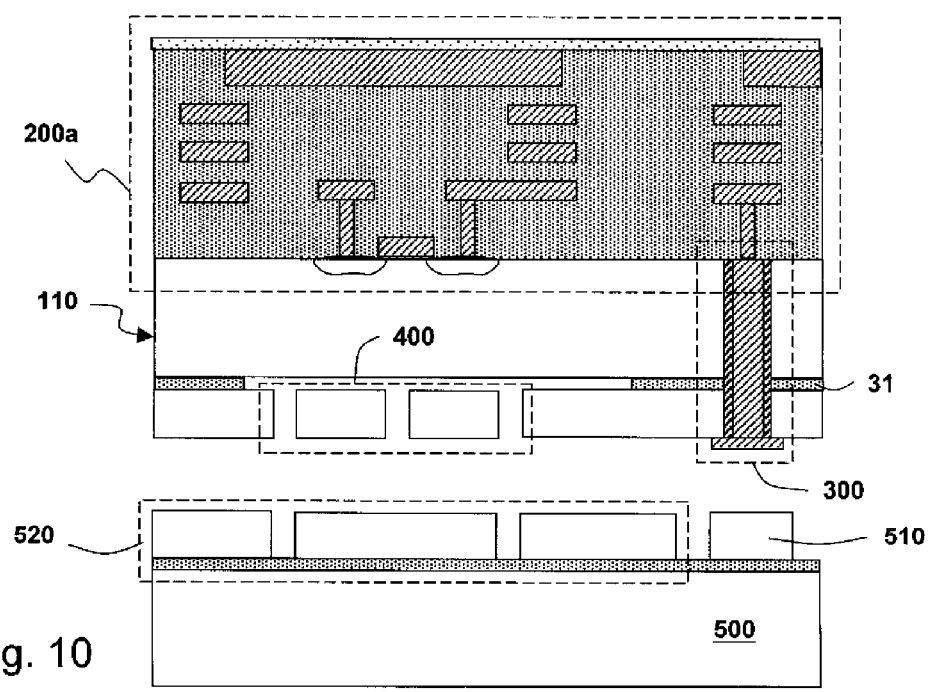
FIG. 10 and FIG. 11 show a second embodiment of the present invention.
Figure 11:
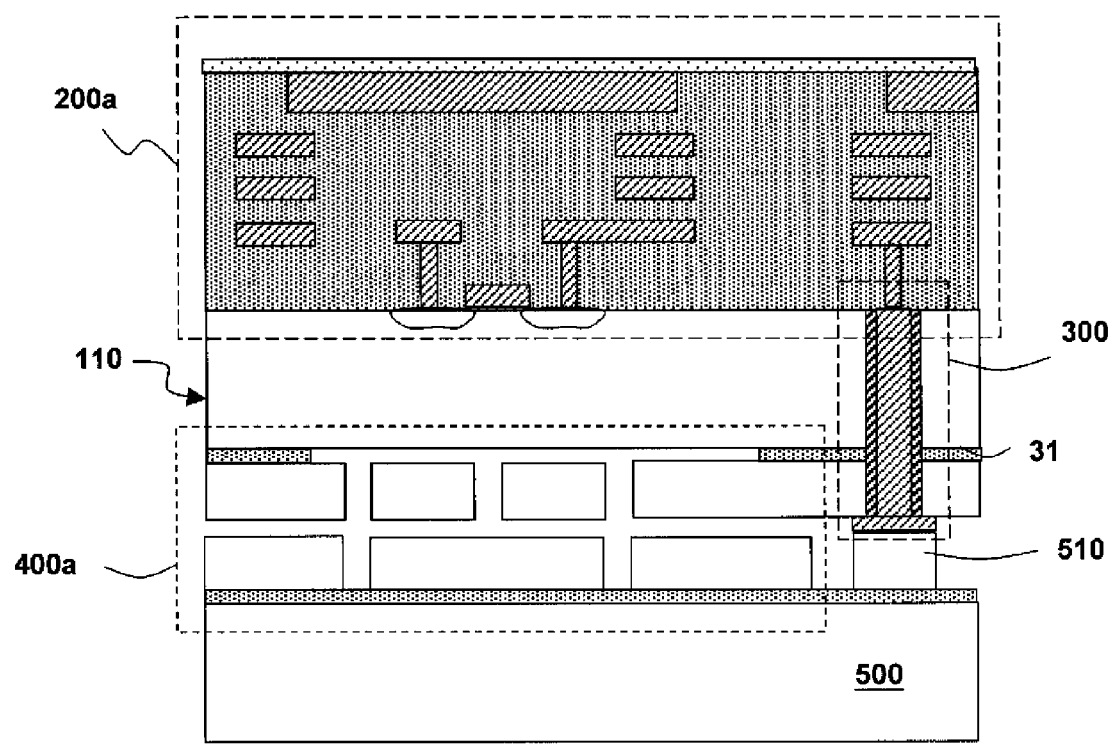

The second embodiment of the present invention is described below. In this second embodiment, after the steps of FIGS. 3-8, referring to FIG. 10 and FIG. 11, a second substrate 500 is provided, which can be a silicon substrate for example. An electrical connection terminal 510 and a second MEMS device area 520 are formed in the second substrate 500. The electrical connection terminal 510 is for electrically connecting the second substrate 500 and the first substrate 110 to transmit electronic signals therebetween; the electrical connection 510 for example can be, but not limited to, connected to the conductive interconnection structure 300. The second MEMS device area 520 can be formed in the substrate, or can also include materials formed on the substrate by deposition, lithography, and etching, with the materials of silicon, metal, and/or insulator layers, etc. The second substrate 500 and the first substrate 110 can be bonded by any method mentioned above such as glass frit, solder, or by using a photo-sensitive polymer as the bonding material. As shown in FIG. 11, after the first substrate 110 is bonded with the second substrate 500, the second MEMS device area 520 and the first MEMS device 400 can functionally connect and cooperate with each other to achieve a module function, i.e., the MEMS device 400a, which for example can be an out-of-plane sensor capable of sensing a vertical movement. In a preferred embodiment, in the periphery region and not shown in the figure, an airtight material is used to seal the MEMS device 400a and the electrical connections (510 and 300). The sealing step can be done during the bonding step of the second substrate 500 and the first substrate 110.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the materials, number of metal layers, etc, in the described embodiments are only for instance, which can be modified in various ways. For another example, the microelectronic device integrated with the MEMS device is not limited to a CMOS device. The microelectronic device can also include a bipolar transistor, an optoelectronic device, etc. In view of the foregoing, the spirit of the present invention should cover all such and other modifications and variations, which should be interpreted to fall within the scope of the following claims and their equivalents.

What is claimed is:

1. A method for making a MEMS chip, comprising:
   providing a first substrate having a first surface and a second surface opposing each other;
   forming a microelectronic device area on the first surface, wherein the microelectronic device area includes a microelectronic device and metal layers;
   after forming the microelectronic device area, etching the first substrate from the second surface and penetrating the first substrate to reach the first surface, and forming a conductive interconnection structure through the first substrate to electrically connect to the microelectronic device area;
   after forming the conductive interconnection structure, forming a first MEMS device area on the second surface to electrically connect to the conductive interconnection structure.

2. The method of claim 1, wherein the first substrate is a silicon-on-insulator (SOI) substrate.

3. The method of claim 2, wherein the steps of forming the first MEMS device area includes: etching a silicon part and an insulator part of the SOI substrate to form a movable part.

4. The method of claim 1 further comprising:
   forming a protection layer on the second surface before forming the microelectronic device area.

5. The method of claim 4, further comprising: removing the protection layer on the second surface before etching the first substrate from the second surface, and wherein the step of forming the conductive interconnection structure through the first substrate includes:
   filling a barrier material; and
   filling a conductive material.

6. The method of claim 1 further including:
   after forming the first MEMS device area, forming an encapsulation layer to encapsulate the first MEMS device area.

7. The method of claim 1 further comprising:
   providing a second substrate;
   forming a second MEMS device area on the second substrate; and
   bonding the second substrate and the first substrate such that the second MEMS device area and the first MEMS device area cooperate with each other.

* * * * *